(12) United States Patent
Koresawa

(10) Patent No.: US 9,397,077 B2
(45) Date of Patent: Jul. 19, 2016

(54) DISPLAY DEVICE HAVING FILM SUBSTRATE

(71) Applicant: Panasonic Intellectual Property Management Co., Ltd., Osaka (JP)

(72) Inventor: Kouhei Koresawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/941,226

(22) Filed: Nov. 13, 2015

(65) Prior Publication Data

US 2016/0172346 A1 Jun. 16, 2016

(30) Foreign Application Priority Data

Dec. 11, 2014 (JP) .................................. 2014-251241

(51) Int. Cl.
*H01L 25/16* (2006.01)
*H01L 23/29* (2006.01)
*H01L 33/56* (2010.01)
*H01L 23/498* (2006.01)

(52) U.S. Cl.
CPC ............ *H01L 25/167* (2013.01); *H01L 23/293* (2013.01); *H01L 23/4985* (2013.01); *H01L 33/56* (2013.01)

(58) Field of Classification Search
CPC ......... H01L 33/52; H01L 33/56; H01L 33/54; G09G 2300/0439; G09G 2300/0469; G09G 2300/08

See application file for complete search history.

(56) References Cited

U.S. PATENT DOCUMENTS

| 9,309,446 B2 * | 4/2016 | Mitsukura ............... C09J 7/0203 |
| 2012/0160405 A1 * | 6/2012 | Namikawa ............ H01L 51/003 156/247 |
| 2012/0248632 A1 * | 10/2012 | Mitsukura ............... C09J 7/0203 257/787 |
| 2013/0293816 A1 * | 11/2013 | Jung .................. H01L 23/49827 349/139 |
| 2013/0306231 A1 * | 11/2013 | Tanaka .............. G02F 1/133305 156/247 |
| 2014/0332770 A1 * | 11/2014 | Im ........................... H01L 23/12 257/40 |
| 2015/0060869 A1 * | 3/2015 | Ro ....................... H01L 27/1266 257/72 |

FOREIGN PATENT DOCUMENTS

| JP | 2002-284826 | 10/2002 |
| JP | 2002284826 A | * 10/2002 |
| JP | 2009-271236 | 11/2009 |
| JP | 2009271236 A | * 11/2009 |
| JP | 201 21 421 8 | * 7/2012 |
| JP | 2012-142189 | 7/2012 |
| JP | WO 2013021560 A1 * | 2/2013 ........ G02F 1/133305 |
| JP | 2013-148768 | 8/2013 |
| JP | 2013148768 A | * 8/2013 |
| JP | 2014-135286 | 7/2014 |
| WO | 2013/021560 | 2/2013 |

* cited by examiner

*Primary Examiner* — Earl Taylor
(74) *Attorney, Agent, or Firm* — Greenblum & Bernstein P.L.C.

(57) ABSTRACT

A display device comprises: a film substrate; display pixels; a flexible printed circuit board and/or a driver integrated circuit; a protective resin that covers, in a plan view of the film substrate, an outer edge of the driver integrated circuit and/or part of the flexible printed circuit board; a fixing substrate; and an adhesive layer that bonds the film substrate to the fixing substrate. The film substrate has a first area including at least an outer edge of the protective resin in a plan view of the film substrate. In the first area, a product of a thickness t [m] of the film substrate by a shear strength X [N/m²] of the film substrate is greater than a peel strength Y [N/m] with which the film substrate is separated from the fixing substrate.

8 Claims, 13 Drawing Sheets

FIG. 8
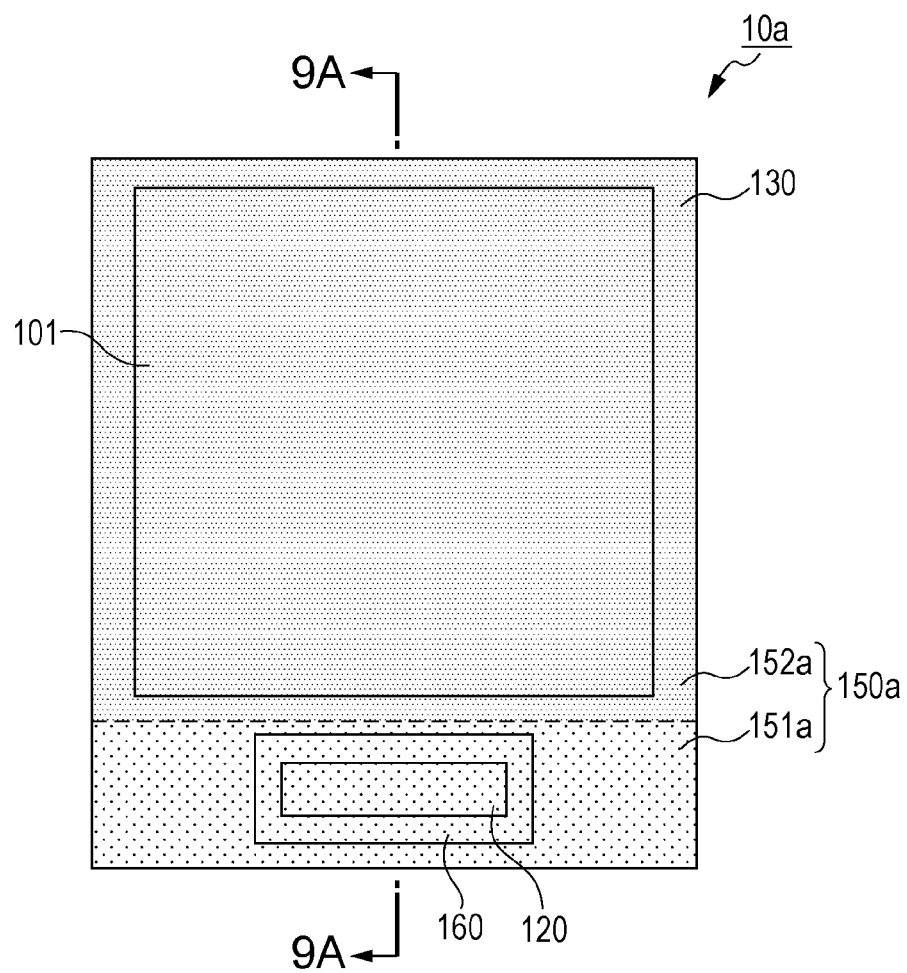
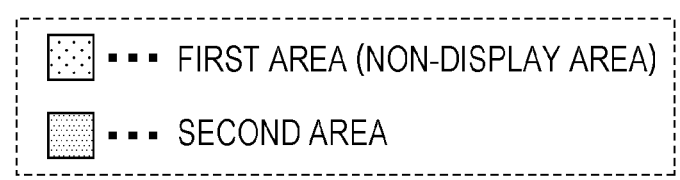

FIG. 10
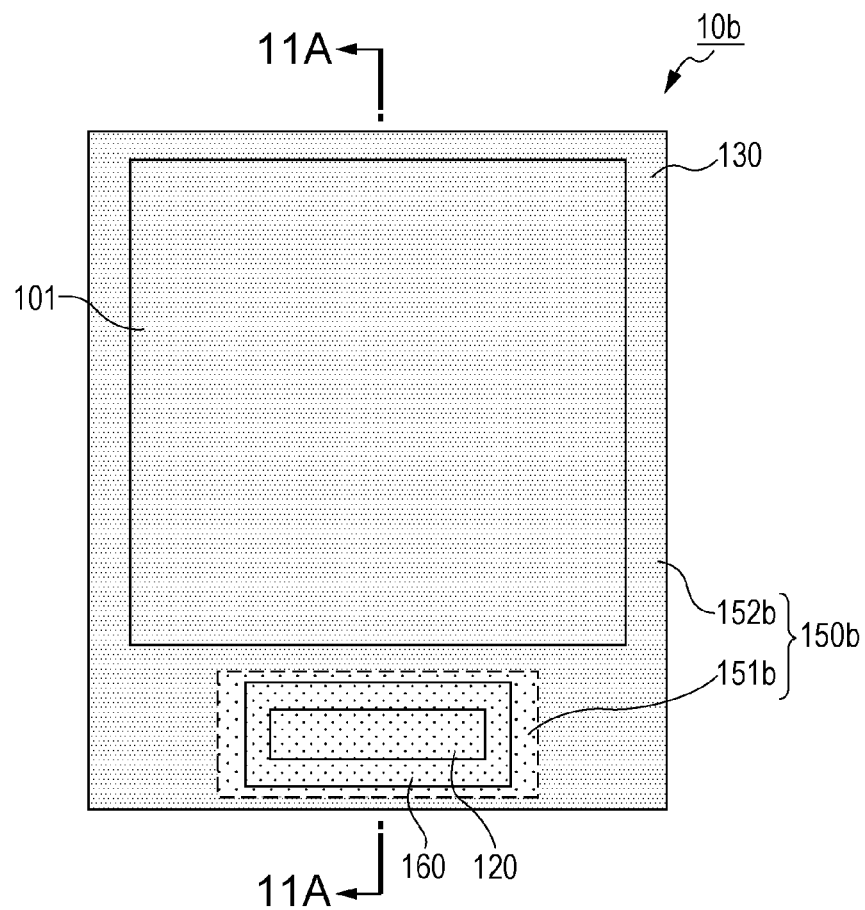
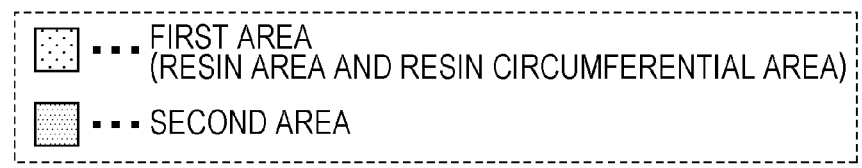

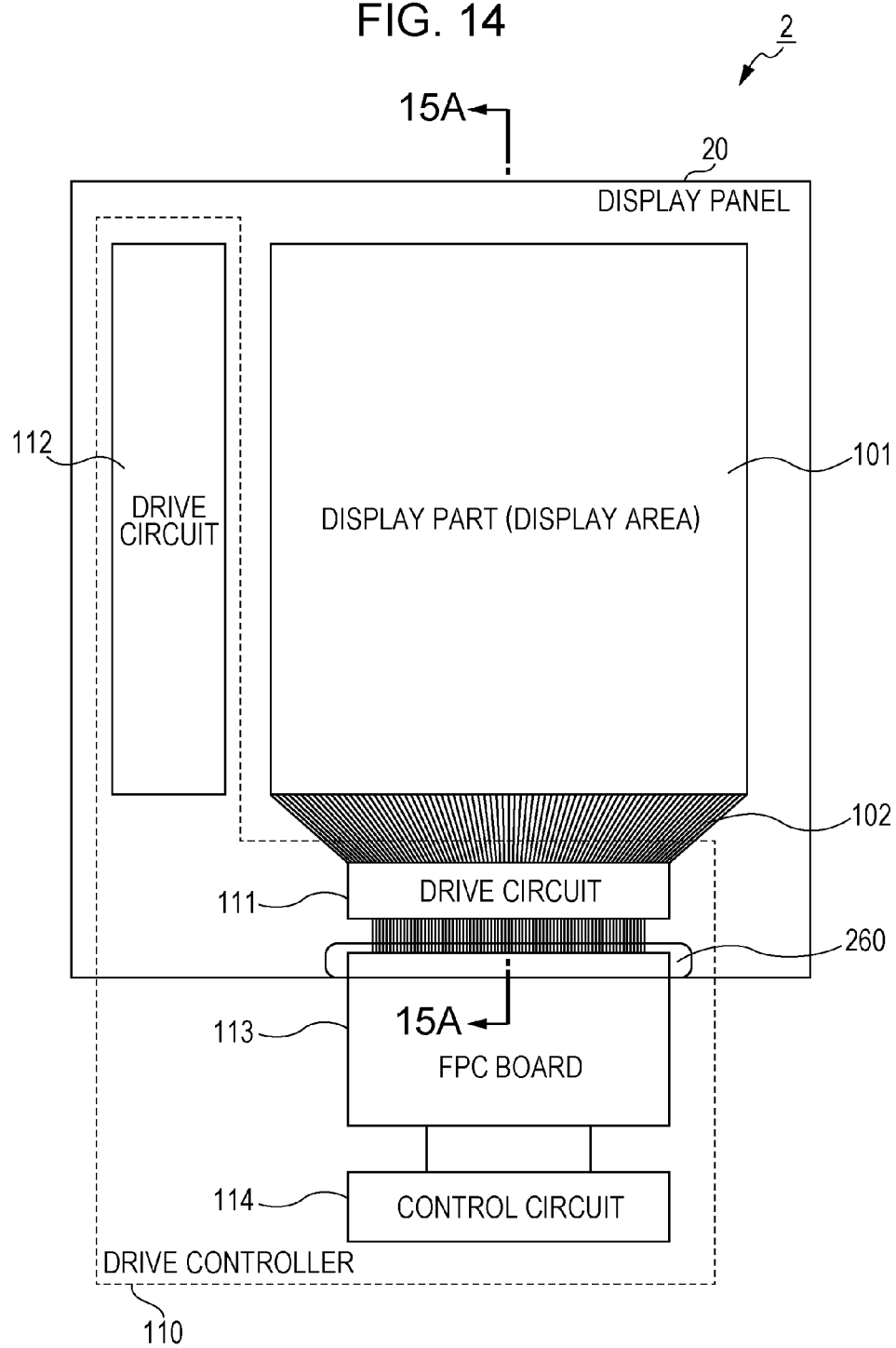

DISPLAY DEVICE HAVING FILM SUBSTRATE

BACKGROUND

1. Technical Field

The present disclosure relates to a display device that uses a film substrate.

2. Description of the Related Art

Recently, curved displays are attracting attention as display bodies that are superior in design and visibility. Display devices having a display part that can be bent or rounded are also being widely developed as display bodies that are superior in storage and portability.

The display parts of these display devices need to be curved, so their display substrates are demanded to be flexible. Therefore, a resin film substrate, for example, is used as such a display substrate.

Resin film substrates often have a thickness of about 10 to 100 μm to, for example, suppress their dimensions from being changed due to heat generated in a display panel manufacturing process. If a display panel uses a resin film substrate with a thickness of about 10 to 100 μm, its shape is easily changed due to its thin thickness and high flexibility. Therefore, it is difficult to maintain a desired panel shape only with the resin film substrate.

In view of this, a technology in which a fixing resign member is attached to a surface opposite to the display surface of the resin film substrate is disclosed in, for example, Japanese Unexamined Patent Application Publication No. 2013-148768. Since the fixing resign member is attached to the resin film substrate, it is possible to increase the capability of maintaining the shape and suppress display elements, drive elements, a wire layer, and the like from being destroyed due to excessive deformation.

SUMMARY

In one general aspect, the techniques disclosed here feature a display device that comprises: a film substrate; display pixels; a flexible printed circuit board and/or a driver integrated circuit; a protective resin that covers, in a plan view of the film substrate, an outer edge of the driver integrated circuit and/or part of the flexible printed circuit board; a fixing substrate; and an adhesive layer that bonds the film substrate to the fixing substrate. The film substrate has a first area including at least an outer edge of the protective resin in a plan view of the film substrate. In the first area, a product of a thickness t [m] of the film substrate by a shear strength X [N/m$^2$] of the film substrate is greater than a peel strength Y [N/m] with which the film substrate is separated from the fixing substrate.

According to the present disclosure, it is possible to suppress a shear failure from occurring in a film substrate.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a plan view illustrating the placement of an adhesive layer in a display panel in a second example in the embodiment;

FIG. 10 is a plan view illustrating the placement of an adhesive layer in a display panel in a third example in the embodiment;

FIG. 14 is a plan view illustrating the structure of a display device in a modification of the embodiment;

DETAILED DESCRIPTION

Figure 1:
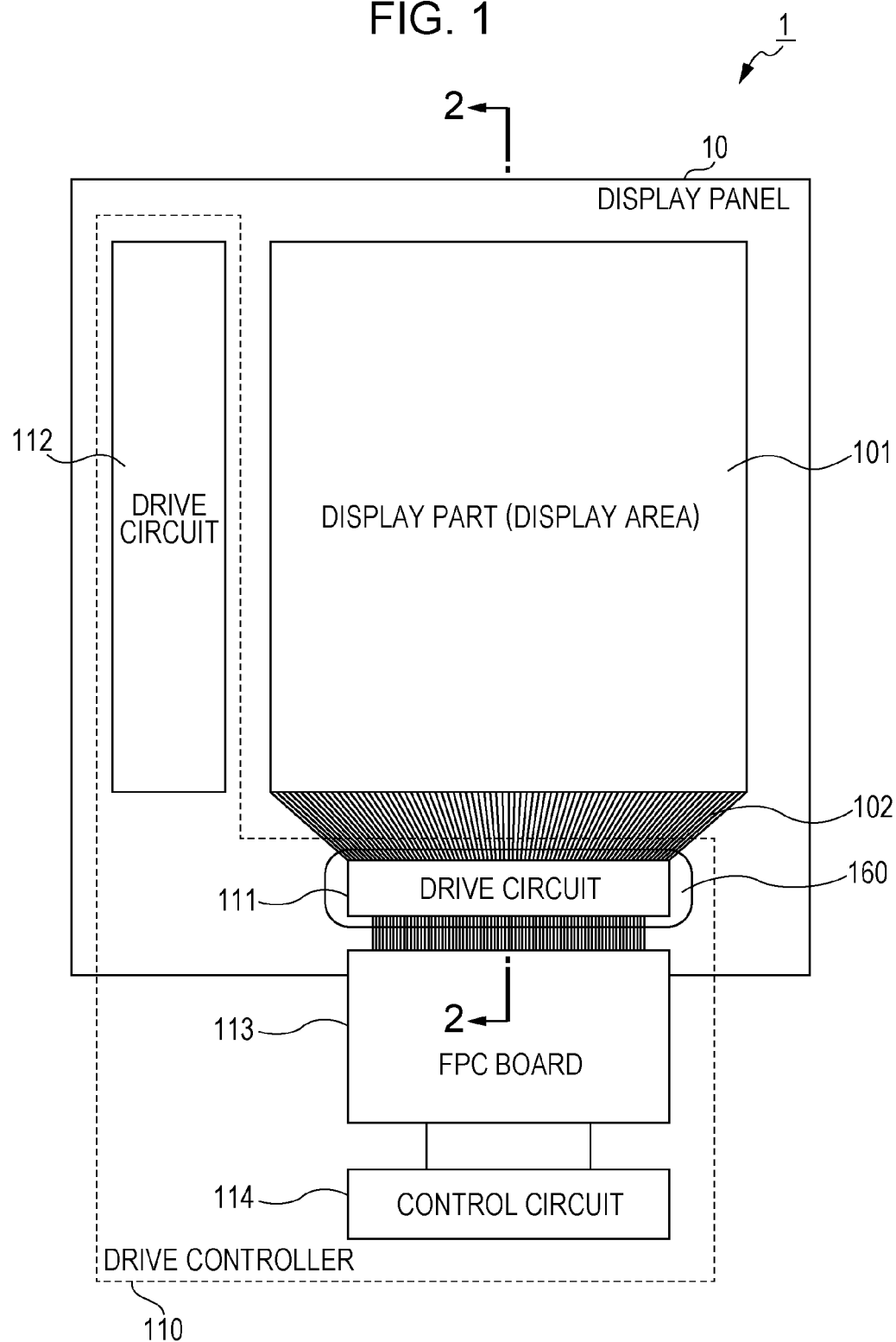
FIG. 1 is a plan view illustrating the structure of a display device in an embodiment.

As a result of the research conducted by the present inventor, it has been turned out that the film substrate of the conventional display device described above may undergo a shear failure depending on factors such as the adhesive strength of an adhesive used to bond the film substrate and fixing resin member together when a force is applied to the film substrate. Thus, the present inventor conducted extensive research to reduce occurrence of a shear failure.

Outline of the Present Disclosure

A display device according to an aspect of the present disclosure includes: a film substrate having a first main surface and a second main surface that is opposite to the first main surface; display pixels located on the film substrate; at least one selected from the group consisting of a flexible printed circuit board located on the first main surface and a driver integrated circuit (IC) that is located on the first main surface and drives the display pixels; a protective resin that covers, in a plan view of the film substrate, at least an outer edge of at least one of the driver integrated circuit and part of the flexible printed circuit board; a fixing substrate facing the second main surface; and an adhesive layer that is located between the second main surface and the fixing substrate, and bonds the film substrate to the fixing substrate. The film substrate has a first area including at least an outer edge of the protective resin in a plan view of the film substrate. In the first area, a product of a thickness t [m] of the film substrate by a shear strength X [N/m$^2$] of the film substrate is greater than a peel strength Y [N/m] with which the film substrate is separated from the fixing substrate.

In this case, a shear force is applied to a cross-section of the film substrate, the cross-section including a circumferential edge of the protective resin, due to a tensile force generated by the contraction of the protective resin in a direction away from the fixing substrate and a tensile force generated by the adhesive layer in a direction toward the fixing substrate. With the display device in this aspect, the product of t by X is larger than Y, the film substrate is separated from the fixing substrate before a shear failure occurs. This can suppress the film substrate from undergoing a shear failure. An adhesive layer with a stronger adhesive strength, for example, can also be formed in an area excluding the circumferential edges of the protective resin. Thus, the shape of the film substrate can be maintained, achieving superior display quality and high reliability.

The first area may further include an area covered with the protective resin in a plan view of the film substrate.

Therefore, an adhesive layer with a stronger adhesive strength can be formed in, for example, an area other than the protective resin. Thus, the shape of the film substrate can be maintained, achieving superior display quality and high reliability.

If, for example, the film substrate has a display area on which the display pixels are provided and a non-display area on which the display pixels are not provided but at least one selected from the group consisting of the flexible printed circuit board and the driver IC is located, the first area may include the non-display area.

Therefore, an adhesive layer with a stronger adhesive strength can be formed on, for example, the display area. Thus, the shape of the display area of the film substrate can be maintained, achieving superior display quality and high reliability.

The first area may further include the display area.

Therefore, the adhesive layer can be formed by using a single type of adhesive resin material, so the adhesive layer can be easily formed.

The adhesive layer may include a first adhesive layer formed between the second main surface in the first area and the fixing substrate; and the peel strength Y may be a strength with which the film substrate is separated from the first adhesive layer.

Therefore, since the film substrate is separated from the first layer before a shear failure occurs, it is possible to suppress the film substrate from undergoing a shear failure.

The adhesive layer may include a first adhesive layer formed between the second main surface in the first area and the fixing substrate; and the peel strength Y may be a strength with which the film substrate is separated from the fixing substrate together with the first adhesive layer.

Therefore, since the film substrate is separated from the fixing substrate together with the first adhesive layer before a shear failure occurs, it is possible to suppress the film substrate from undergoing a shear failure.

The film substrate may have a second area different from the first area. The adhesive layer may further include a second adhesive layer between the second main surface in the second area and the fixing substrate, the second adhesive layer having a stronger adhesive strength than the first adhesive layer.

Therefore, since the second adhesive layer having a stronger adhesive strength than the first adhesive layer is formed in the second area, it is possible to suppress the film substrate from being separated from the fixing substrate. In the second area, no protective resin is provided, so a shear force is not exerted on the second area. Therefore, it is possible to suppress the film substrate from undergoing a shear failure and more strongly maintain the shape of the film substrate.

For example, the adhesive layer may not be provided on the first area.

Therefore, since no adhesive layer is provided on the first area, a force with which the film substrate is pulled by the adhesive layer is not exerted on the first area. Even if the protective resin contracts, therefore, a shear force is not exerted on the first area, making it possible to suppress the film substrate from undergoing a shear failure.

Embodiments will be specifically described with reference to the drawings.

All embodiments described below illustrate comprehensive or specific examples. Numerals, shapes, materials, constituent elements, the placement positions and connection forms of these constituent elements, steps, the sequence of these steps, and the like are only examples, and are not intended to restrict the present disclosure. Of the constituent elements described in the embodiments below, constituent elements not described in independent claims, each of which indicates the topmost concept, will be described as optional constituent elements.

Embodiment

1. Display Device

First, the structure of a display device in an embodiment will be described with reference to FIG. 1. FIG. 1 is a plan view of the structure of a display device 1 in this embodiment, schematically illustrating the functional structure of the display device 1 and its layout.

As illustrated in FIG. 1, the display device 1 includes a display panel 10 and a drive controller 110.

The display panel 10 is, for example, a top emission organic electro luminescence (EL) display panel. Alternatively, the display panel 10 may be an inorganic EL display panel that uses an inorganic material. The display panel 10 is not limited to a top emission type; it may be of a bottom emission type. Alternatively, the display panel 10 may be a liquid crystal display panel or another active matrix type of display panel.

The display panel 10 includes a display part 101, wires 102, a drive circuit 111, a drive circuit 112, and a flexible printed circuit (FPC) board 113, as illustrated in FIG. 1.

The display part 101 has a plurality of display pixels, which are two-dimensionally placed. Each of the plurality of display pixels has a light-emitting element such as, for example, an organic EL element. The display pixels are driven by the drive circuit 111 and drive circuit 112, and emit light.

The wires 102, each of which is provided for one column of the display panel 10, are electrically connected to the plurality of display pixels in column units. Specifically, each wire 102 is a data signal line that is electrically connected to the drive circuit 111 and transmits a control signal (for example, a pixel signal) received from the drive circuit 111 to the relevant display pixels. The wire 102 is made of, for example, indium tin oxide (ITO), aluminum, silver, copper, titanium or another metal, or any of their alloys.

Although not illustrated in FIG. 1, the display panel 10 also includes a power supply line, wires (such as, for example, scan signal lines) that electrically connect the drive circuit 112 to the plurality of display pixels, and the like.

The drive controller 110 includes the drive circuit 111, the drive circuit 112, the FPC board 113, and a control circuit 114, as illustrated in FIG. 1.

The drive circuit 111 and drive circuit 112 each include at least one driver IC (for example, a driver IC 120 illustrated in FIG. 2) to drive the plurality of display pixels. For example, the drive circuit 111 is a source drive circuit including at least one source driver IC. The drive circuit 112 is a gate drive circuit including at least one gate driver IC. The drive circuit 111 is connected to the control circuit 114 through the FPC board 113. The drive circuit 111 drives the plurality of display pixels in response to control signals from the control circuit 114.

On the FPC board 113, wires that are electrically connected to the display pixels are formed. The FPC board 113 is connected to a surface of the display panel 10.

The FPC board 113 is also connected to the control circuit 114 through a flexible flat cable (FFC) or another type of cable. The FPC board 113 receives a control signal output from the control circuit 114 and transmits the signal to the drive circuit 111.

Although not illustrated in FIG. 1, the display panel 10 may also include an FPC board that mutually connects the drive circuit 112 and control circuit 114. Alternatively, the FPC board 113 may be electrically connected to the drive circuit 112 through, for example, a wire provided in the display panel 10 and may transmit a control signal received from the control circuit 114 to the drive circuit 112.

The control circuit 114 outputs control signals that control the drive circuit 111 and drive circuit 112. The control circuit 114 is, for example, a timing controller (TCON). It supplies clock signals to the drive circuit 111 and drive circuit 112 to control various operation timings.

The placement of the drive circuit 111 and drive circuit 112 and the number of drive circuits 111 and drive circuits 112 are not limited to the example illustrated in FIG. 1. For example, four drive circuits may be provided along the four edges of the display part 101. Alternatively, a circuit in which the drive circuit 111, drive circuit 112, and control circuit 114 are integrated may be provided.

2. Display Panel

Figure 2:
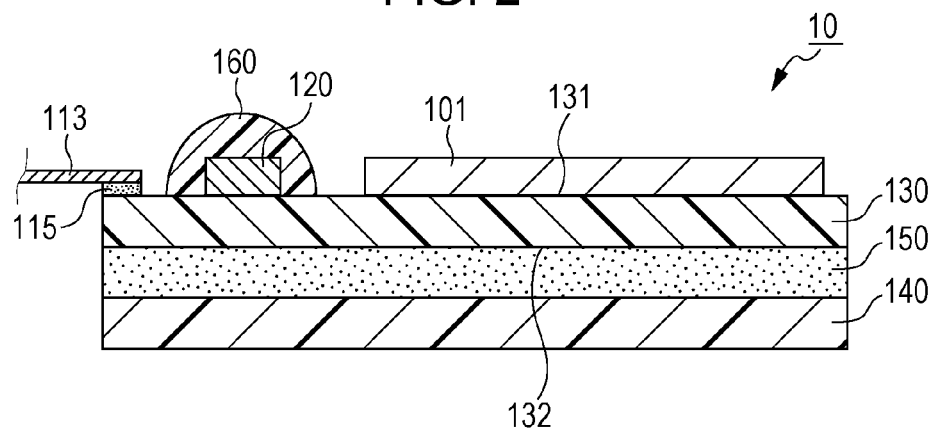
FIG. 2 is a cross-sectional view illustrating the structure of a display panel in the embodiment.

The structure of the display panel 10 will be described below in detail with reference to FIG. 2. FIG. 2 is a cross-sectional view illustrating the structure of the display panel 10 in this embodiment, as taken along a line 2-2 in FIG. 1. Specifically, FIG. 2 illustrates a cross-section that passes through the display part 101, the driver IC 120, and a protective resin 160.

The display panel 10 includes a film substrate 130, a fixing substrate 140, an adhesive layer 150, and the protective resin 160, as illustrated in FIG. 2.

2-1. Film Substrate

The film substrate 130 has a first main surface 131 and a second main surface 132 opposite to the first main surface 131. The first main surface 131 is a main surface opposite to the adhesive layer 150 and fixing substrate 140.

On the first main surface 131, the display part 101 (specifically, a plurality of display pixels), driver IC 120, and FPC board 113 are provided, as illustrated in FIG. 2. In this embodiment, the driver IC 120 is mounted directly on the panel substrate of the display panel 10 (specifically, on the film substrate 130). That is, the display panel 10 uses a so-called chip-on-glass (COG) method. The driver IC 120 is a chip that has an integrated circuit including a plurality of transistors and the like.

On the first main surface 131, the protective resin 160 is also provided so as to cover the driver IC 120. The protective resin 160 is provided to protect the driver IC 120 and a connected portion between the driver IC 120 and the film substrate 130 from a shock, moisture, contamination, and the like.

On the film substrate 130, the wires 102 (not illustrated in FIG. 2) are further formed by using aluminum or the like. When the wires 102 are formed, the FPC board 113 is bonded to the first main surface 131 with a conductive adhesive 115 intervening between them so that the FPC board 113 is electrically connected to the wires 102. The conductive adhesive 115 is, for example, an anisotropic conductive film (ACF). Thereby, the FPC board 113 is provided on the film substrate 130. Note that, in this disclosure, "located on a/the film substrate" means that "located directly or indirectly on a/the film substrate". The display pixels may also bonded to the first main surface 131 with solder or the like intervening between the display pixels and the film substrate 130 so that the display pixels are electrically connected to the wires 102. Further, the driver IC 120 may also bonded to the first main surface 131 with solder or the like intervening between the driver IC 120 and the film substrate 130 so that the driver IC 120 is electrically connected to the wires 102. Thereby, the display pixels and the driver IC 120 are located on the film substrate 130.

The film substrate 130 is a flexible substrate. The film substrate 130 is made of, for example, a resin material. Examples of resin materials available to the film substrate 130 include polyimide (PI), polyamide (PA), polyamide-imide (PAI), polyether ether ketone (PEEK), polyethylene naphthalate (PEN), polyethylene terephthalate (PET), cyclo olefin polymer (COP), poly ether sulphone (PES), polycarbonate (PC), and polymethyl methacrylate (PMMA). The thickness of the film substrate 130 is, for example, 10 to 100 μm.

When the film substrate 130 is used, the display panel 10 can be used as a flexible display. Even if the display panel 10 is not used as a flexible display, the use of the film substrate 130 enables the display panel 10 to be lightweight.

2-2. Fixing Substrate

The fixing substrate 140 is disposed so as to face the second main surface 132 of the film substrate 130. The fixing substrate 140 is used to maintain the film substrate 130 in a desired product shape. Therefore, the fixing substrate 140 is made of a material having higher rigidity than the film substrate 130. The fixing substrate 140 may have flexibility. In this case, the display panel 10 can be used as a flexible display.

The fixing substrate 140 is made of, for example, a resin material. Examples of resin materials available to the fixing substrate 140 include polyimide (PI), polyamide (PA), polyamide-imide (PAI), polyether ether ketone (PEEK), polyethylene naphthalate (PEN), and polyethylene terephthalate (PET). Alternatively, the fixing substrate 140 may be made of a glass material. The thickness of the fixing substrate 140 is, for example, 100 to 500 µm.

2-3. Adhesive Layer

The adhesive layer 150 is disposed between the fixing substrate 140 and the second main surface 132 of the film substrate 130 so as to bond (stick) the film substrate 130 and fixing substrate 140 together.

The adhesive layer 150 is made of, for example, an adhesive resin material. Examples of resin materials available to the adhesive layer 150 include silicone adhesive resins, acrylic adhesive resins, epoxy adhesive resins, polyvinyl acetate adhesive resins, phenolic adhesive resins, and vinyl acetate adhesive resins.

The adhesive strength (adhesion strength) of the adhesive layer 150 has been adjusted according to the materials of the film substrate 130 and fixing substrate 140 so that the film substrate 130 and fixing substrate 140 satisfy a prescribed peeling condition. The peeling condition and the adjustment of the adhesive strength will be described later in detail.

2-4. Protective Resin

The protective resin 160 is disposed on the first main surface 131 so as to cover the circumferential edges of the driver IC 120. Specifically, the circumferential edges of the driver IC 120 is the outline of the driver IC 120 in a plan view.

In this embodiment, the protective resin 160 is disposed so as to cover the whole of the driver IC 120, specifically, so as to prevent the driver IC 120 from being exposed to the outside. If the display panel 10 includes a plurality of driver ICs 120, the protective resin 160 may cover the plurality of driver ICs 120 individually or may cover all of the plurality of driver ICs 120 together.

The protective resin 160 brings the driver IC 120 into tight contact with the film substrate 130 so that the driver IC 120 is fixed to the film substrate 130, suppressing the driver IC 120 from being separated from the film substrate 130. The protective resin 160 is made of a resin material that is highly resistant to moisture. Thus, the protective resin 160 suppresses electrode terminals in the connected portion between the driver IC 120 and the film substrate 130 and other metal materials from being deteriorated due to moisture in the ambience.

The protective resin 160 is made of, for example, an indurative resin material. Specifically, a light curable resin, a thermosetting resin, a moisture curable resin, or a solvent-volatile resin can be used as a resin material of the protective resin 160. For example, the resin material of the protective resin 160 only needs to be a so-called molded material. Examples of the resin material of the protective resin 160 include an acrylic resin, a urethane resin, an epoxy resin, an unsaturated polyester resin, and a silicone resin.

3. Peeling Condition

The peeling condition that film substrate 130 and fixing substrate 140 included in the display panel 10 in this embodiment satisfy will be described below.

In this embodiment, the thickness t [m] of the film substrate 130, the shear strength X [N/m²] of the film substrate 130, and the peel strength Y [N/m] with which the film substrate 130 is separated from the fixing substrate 140 satisfy equation (1) below in a first area in a plan view.

$$t \times X > Y \qquad \text{Equation (1)}$$

The plan view is a view taken when the first main surface 131 of the film substrate 130 is viewed from a direction orthogonal to the first main surface 131 of the film substrate 130 (that is, the direction of the normal to the first main surface 131).

The first area is an area including the circumferential edges of the protective resin 160 (the area will be referred to below as the resin circumferential area). In other words, the first area includes an area corresponding to the outer edge of the protective resin 160. The circumferential edges of the protective resin 160 are specifically the outline of the protective resin 160 in the plan view. That is, the circumferential edges of the protective resin 160 are a boundary, in the plan view, between an area on which the protective resin 160 is disposed (resin area) and an area on which the protective resin 160 is not disposed. The first area will be described later in detail.

3-1. Shear Strength

Figure 3A:
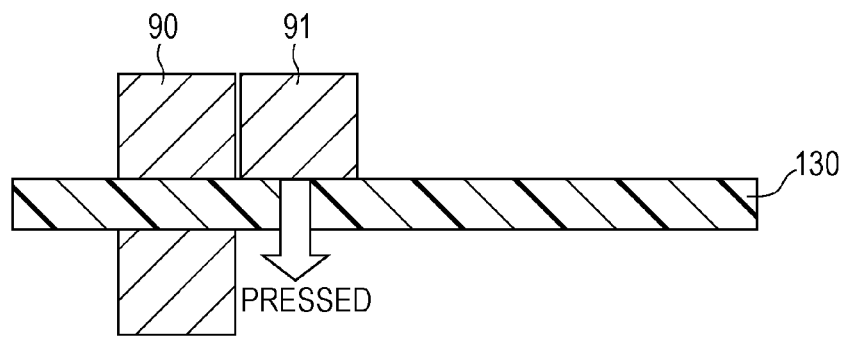
FIG. 3A is a cross-sectional view illustrating a state in which a film substrate in the embodiment undergoes a shear failure.
Figure 3B:
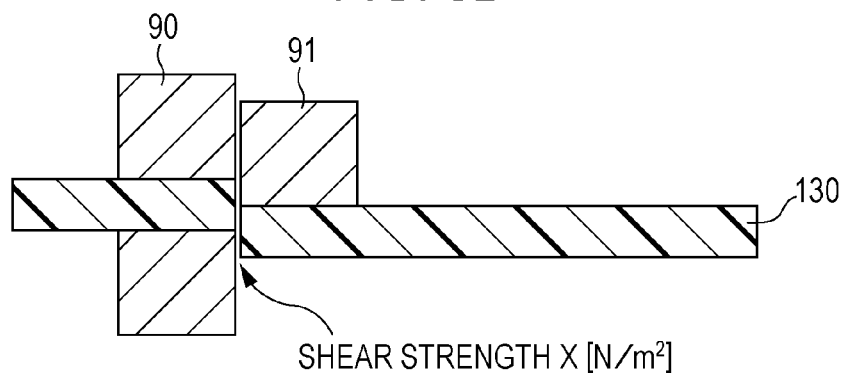
FIG. 3B is a cross-sectional view illustrating a state in which the film substrate in the embodiment has undergone a shear failure.

First, the shear strength X [N/m²] will be described with reference to FIGS. 3A and 3B. FIGS. 3A and 3B are cross-sectional views illustrating a state in which the film substrate 130 in this embodiment undergoes a shear failure.

The shear strength X [N/m²] of the film substrate 130 is a breaking strength at which the film substrate 130 undergoes a shear failure. The shear strength X can be measured in a shear failure test. Specifically, the film substrate 130 is pressed by a pressing member 91 in a state in which the film substrate 130 is held by a holding member 90, as illustrated in FIG. 3A.

When the force with which the pressing member 91 presses the film substrate 130 is gradually increased and exceeds a prescribed level, the film substrate 130 undergoes a shear failure as illustrated in FIG. 3B. The shear strength X [N/m²] of the film substrate 130 is calculated by dividing the pressing force [N] at a time when the shear failure has occurred by the cross section [m²] of the portion of the film substrate 130 at which the shear failure has occurred.

3-2. Peel Strength

Figure 4A:
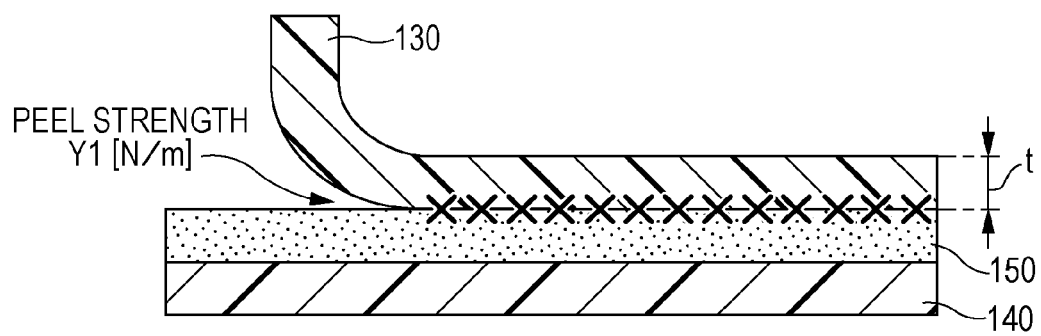
FIG. 4A is a cross-sectional view illustrating a state in which the film substrate in the embodiment is separated from an adhesive layer.
Figure 4B:
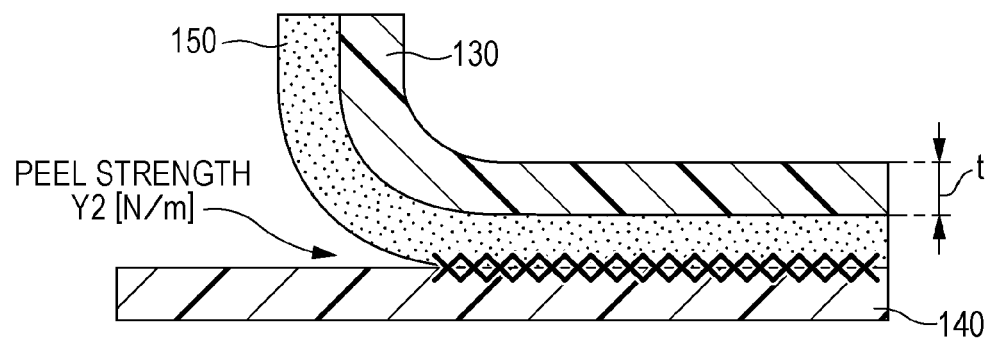
FIG. 4B is a cross-sectional view illustrating a state in which the film substrate in the embodiment is separated from a fixing substrate together with the adhesive layer.

Next, the peel strength Y [N/m] will be described with reference to FIGS. 4A and 4B. FIG. 4A is a cross-sectional view illustrating a state in which the film substrate 130 in this embodiment is separated from the adhesive layer 150. FIG. 4B is a cross-sectional view illustrating a state in which the film substrate 130 in this embodiment is separated from the fixing substrate 140 together with the adhesive layer 150.

In this embodiment, the film substrate 130 is separated from the fixing substrate 140 in two ways illustrated in FIGS. 4A and 4B. Specifically, the film substrate 130 is separated from the adhesive layer 150 bonded to the fixing substrate 140 as illustrated in FIG. 4A, and the film substrate 130 is separated from the fixing substrate 140 together with the adhesive layer 150 as illustrated in FIG. 4B.

In the separation in FIG. 4A, the peel strength Y [N/m] is a peel strength Y1 [N/m] at a time when the film substrate 130 is separated from the adhesive layer 150 bonded to the fixing substrate 140. That is, the peel strength Y1 is determined according to factors including the materials of the film substrate 130 and adhesive layer 150, and the like.

In the separation in FIG. 4B, the peel strength Y [N/m] is a peel strength Y2 [N/m] at a time when the film substrate 130 is separated from the fixing substrate 140 together with the adhesive layer 150. That is, the peel strength Y2 is determined according to factors including the materials of the fixing substrate 140 and adhesive layer 150, and the like.

In the two separations, the peel strength Y [N/m] can be measured in a peeling test. For example, the peel strength Y [N/m] can be measured in a 90-degree peeling test.

3-3. Relationship Between the Protective Resin and a Shear Failure

Now, a case in which the film substrate 130 undergoes a shear failure will be described with reference to FIGS. 5A to 5D. FIGS. 5A to 5D are cross-sectional views illustrating a state in which the film substrate 130 in this embodiment undergoes a shear failure due to the curing of the protective resin 160.

In this embodiment, the protective resin 160 is disposed so as to cover the driver IC 120 for purposes of improving the tight adhesion of the driver IC 120 to the film substrate 130 and suppressing the connected portion between the driver IC 120 and the film substrate 130 from being deteriorated.

Figure 5A:
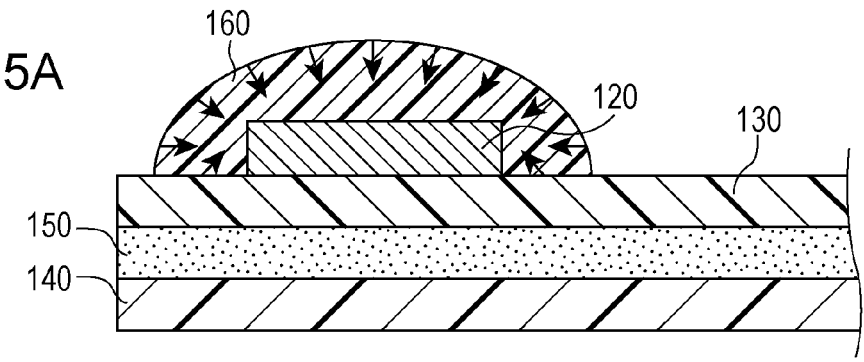
FIG. 5A is a cross-sectional view illustrating a state in which the film substrate in the embodiment undergoes a shear failure due to the curing of a protective resin.

As the protective resin 160, a resin that is polymerized and cured due to moisture in the atmosphere, light in the ultraviolet region (ultraviolet (UV) light), or heat, for example, is widely used (see Japanese Unexamined Patent Application Publication No. 2002-284826, for example). Therefore, as illustrated in FIG. 5A, the volume of the protective resin 160 contracts in the course of the progress of a polymerization reaction during curing and due to exposure to a high-temperature high-humidity ambience after curing, as indicated the bold arrows in the drawing.

Figure 5B:
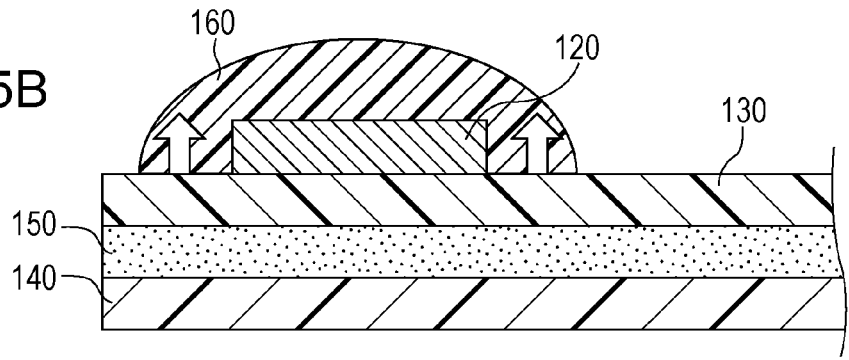
FIG. 5B is a cross-sectional view illustrating a state in which the film substrate in the embodiment undergoes a shear failure due to the curing of the protective resin.

Since the protective resin 160 contracts in a state in which the protective resin 160 is in tight contact with the film substrate 130, as illustrated in FIG. 5B, a force with which the film substrate 130 is pulled toward the protective resin 160 (upward direction) is exerted on the film substrate 130, as indicated by the upward open block arrows in the drawing. That is, a force that follows the contraction of the protective resin 160 is exerted on the film substrate 130 in a direction in which the film substrate 130 is separated from the fixing substrate 140.

Figure 5C:
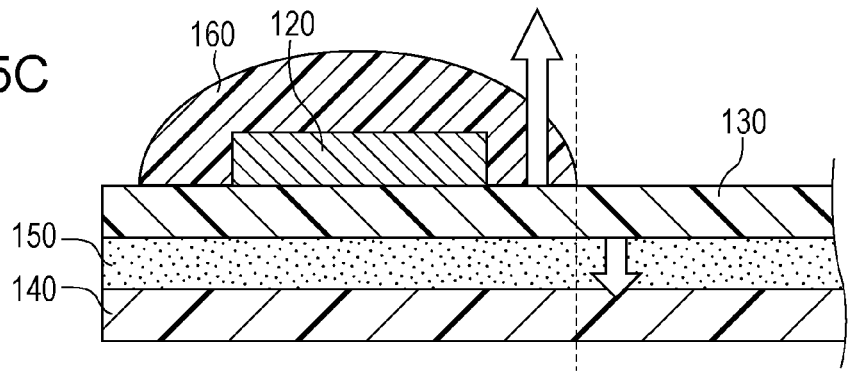
FIG. 5C is a cross-sectional view illustrating a state in which the film substrate in the embodiment undergoes a shear failure due to the curing of the protective resin.

In the area in which the protective resin 160 is not provided as illustrated in FIG. 5C, a force with which the film substrate 130 is pulled toward the fixing substrate 140 (downward direction) is exerted on the film substrate 130 due to the bonding force of the adhesive layer 150, as indicated by the downward open block arrow in the drawing. Therefore, forces are applied to the film substrate 130 in mutually opposite directions in its thickness direction with a circumferential edge (dashed line in FIG. 5C) of the protective resin 160 taken as a boundary.

Specifically, a force in a direction away from the fixing substrate 140 (upward direction) is exerted on the area covered with the protective resin 160 on the film substrate 130, and a force in a direction toward the fixing substrate 140 (downward direction) is exerted on the area not covered with the protective resin 160. That is, a shear force is exerted on the cross section of the film substrate 130 along the circumferential edge of the protective resin 160. The cross section of the film substrate 130 along the circumferential edge of the protective resin 160 is a cross section that is orthogonal to the main surfaces (first main surface 131 and second main surface 132) of the film substrate 130 and passes the circumferential edge of the protective resin 160 (for example, a cross section passing the dashed line in FIG. 5C).

Figure 5D:
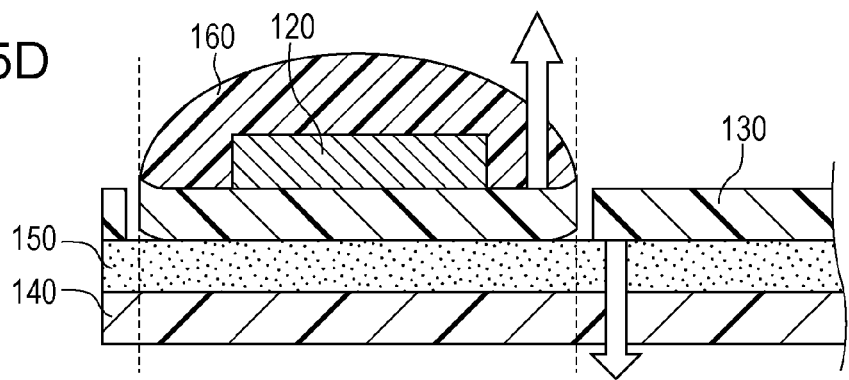
FIG. 5D is a cross-sectional view illustrating a state in which the film substrate in the embodiment has undergone a shear failure due to the curing of the protective resin.

If the shear force exceeds a force corresponding to the shear strength X [N/m$^2$] of the film substrate 130, the film substrate 130 undergoes a shear failure as illustrated in FIG. 5D. When the film substrate 130 undergoes a shear failure, wires 102 formed on the film substrate 130 are broken, causing a display failure.

3-4. Relationship Between the Shear Strength and the Peel Strength

In view of the above situation with regard to the display device 1 in this embodiment, to suppress the film substrate 130 from undergoing a shear failure, the material of the adhesive layer 150 and the like are adjusted so that the film substrate 130 is separated from the fixing substrate 140 before the film substrate 130 undergoes a shear failure. Specifically, the materials of the film substrate 130, fixing substrate 140, and adhesive layer 150, their thicknesses, and the like are set so that equation (1) above is satisfied.

Figure 6:
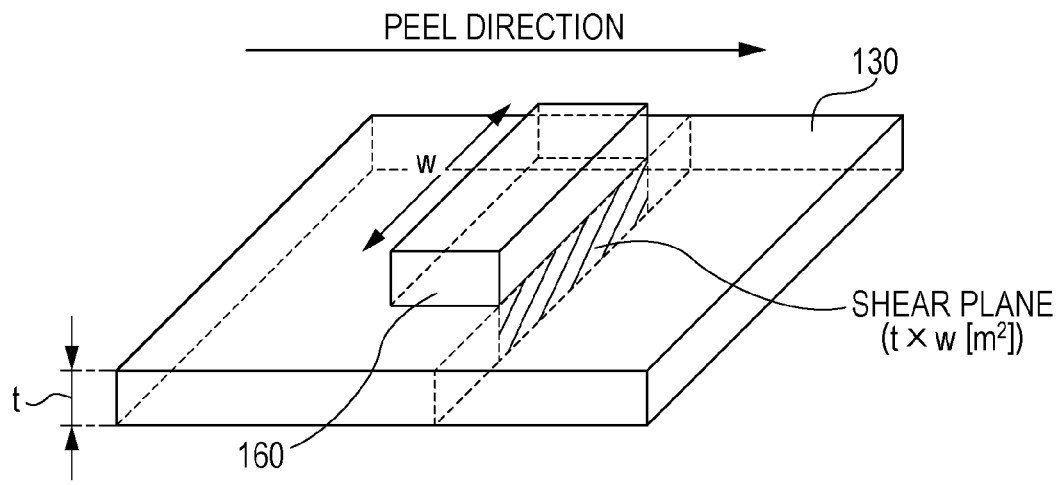
FIG. 6 is a perspective view illustrating the placement of the film substrate and protective resin in the embodiment and a direction in which the film substrate is separated.

A method of deriving equation (1) will be described below with reference to FIG. 6. FIG. 6 is a perspective view illustrating the placement of the film substrate 130 and protective resin 160 in this embodiment and a direction in which the film substrate 130 is separated. In FIG. 6, the protective resin 160 is schematically illustrated as having a flat rectangular parallelepiped shape. The length of the protective resin 160 in its longitudinal direction will be denoted w [m].

As described above with reference to FIGS. 5A to 5D, the place at which the film substrate 130 undergoes a shear failure due to the contraction of the protective resin 160 is the cross section of the film substrate 130 along a circumferential edge of the protective resin 160. Here, as an example, a case will be described in which a shear failure occurs on a cross section along a circumferential edge that extends along the longitudinal direction of the protective resin 160 illustrated in FIG. 6. (The length of the protective resin 160 in the longitudinal direction is w [m]).

In this case, if a force with which the film substrate 130 is pulled due to the contraction of the protective resin 160 is less than t×w×X [N], the film substrate 130 does not undergo a shear failure. If the force is t×w×X [N] or more, the film substrate 130 undergoes a shear failure. If a force with which the film substrate 130 is pulled in the thickness direction of the film substrate 130 is less than w×Y [N], the film substrate 130 is not separated. If the force is w×Y [N] or more, the film substrate 130 is separated.

Therefore, to separate the film substrate 130 from the fixing substrate 140 before the film substrate 130 undergoes a shear failure, it is only necessary for the peel force at a time when the film substrate 130 undergoes a shear failure to be larger than the peel force at a time when the film substrate 130 is separated. That is, it suffices to meet equation (2) below.

$$t \times w \times X > w \times Y \qquad \text{Equation (2)}$$

Therefore, equation (1) is derived by organizing equation (2).

So far, a case in which a shear failure occurs in the longitudinal direction of the protective resin 160 has been described. However, the same is true for a case in which a shear failure occurs in a direction along the shorter edges of the protective resin 160 and for a case in which the protective resin 160 is not a rectangular parallelepiped.

Thus, in this embodiment, the thickness t [m] and material of the film substrate 130, the material of the fixing substrate 140, and the material of the adhesive layer 150 are set so as to satisfy at least one of equation (3) and equation (4) below.

$$t \times X > Y1 \quad \text{Equation (3)}$$

$$t \times X > Y2 \quad \text{Equation (4)}$$

If equation (3) is satisfied, the film substrate 130 is separated from the adhesive layer 150 before the film substrate 130 undergoes a shear failure. If equation (4) is satisfied, the film substrate 130 is separated from the fixing substrate 140 together with the adhesive layer 150 before the film substrate 130 undergoes a shear failure.

In this embodiment, therefore, it is possible to suppress the film substrate 130 from undergoing a shear failure.

4. Examples of the Display Panel

In this embodiment, equation (1) is satisfied in the first area in a plan view. The first area is an area that includes at least the circumferential edges of the protective resin 160 (i.e. the resin circumferential area) in a plan view. Therefore, equation (1) does not need to be satisfied in an area other than the resin circumferential area.

The first area may also include an area other than the resin circumferential area. In this embodiment, the adhesive strength (or material) of the adhesive layer 150 and its placement were adjusted so as to satisfy equation (1). First to fourth examples will be described below for the display panel in this embodiment.

4-1. First Example

Whole Area (Display Area and Non-Display Area)

Figure 7:
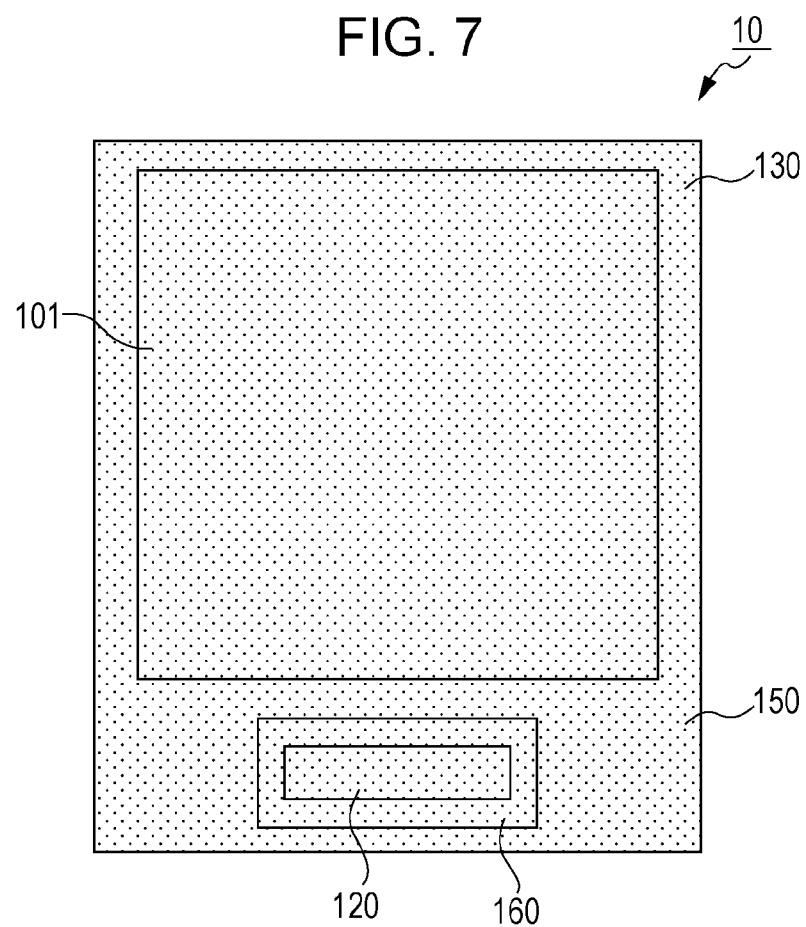
FIG. 7 is a plan view illustrating the placement of an adhesive layer in the display panel in a first example in the embodiment.

FIG. 7 is a plan view illustrating the placement of the adhesive layer 150 in the display panel 10 in a first example in this embodiment.

In the first example, the first area (dot-shaded area in FIG. 7) is the whole area of the film substrate 130 in a plan view. That is, the first area includes not only the resin circumferential area but also a display area, on which the display part 101 (including a plurality of display pixels) is disposed, the peripheral area of the display area, and a non-display area, in which the driver IC 120 and the like are disposed.

Thus, in the first example, equation (1) is satisfied in the whole area (i.e. the first area) of the film substrate 130 in a plan view. Specifically, at least one of equation (3) and equation (4) is satisfied in the whole area of the film substrate 130 in a plan view.

Therefore, since the film substrate 130 is separated from the fixing substrate 140 before the film substrate 130 undergoes a shear failure, it is possible to suppress a shear failure from occurring in the film substrate 130. It is desirable for the adhesive layer 150 to be made of a single type of adhesive resin material that satisfies at least one of equation (3) and equation (4). This enables the adhesive layer 150 to be easily formed.

As described above, when the display panel 10 in the first example is used, it is possible to suppress the film substrate 130 from undergoing a shear failure and thereby provide the display device 1 that achieves superior display quality and high reliability.

4-2. Second Example

Non-Display Area

Figure 9A:
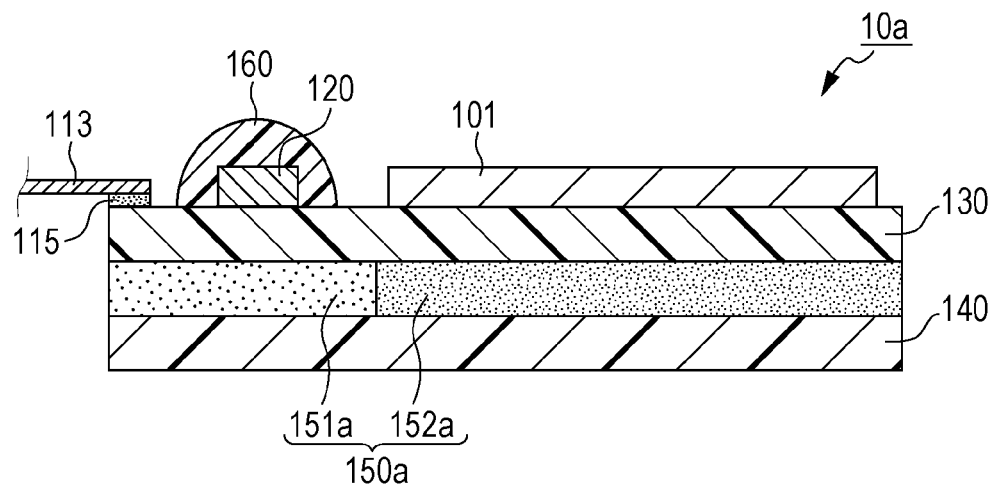
FIG. 9A is a cross-sectional view illustrating the structure of the display panel in the second example in the embodiment.

FIG. 8 is a plan view illustrating the placement of an adhesive layer 150a in a display panel 10a in a second example in this embodiment. FIG. 9A is a cross-sectional view illustrating the structure of the display panel 10a in the second example in this embodiment, as taken along a line 9A-9A in FIG. 8.

In the second example, the adhesive layer 150a includes a first adhesive layer 151a provided on the first area of the film substrate 130 and a second adhesive layer 152a provided on a second area of the film substrate 130, as illustrated in FIGS. 8 and 9A. The second area is an area different from the first area in a plan view of the film substrate 130.

The first adhesive layer 151a is an adhesive layer that satisfies at least one of equation (3) and equation (4). That is, the peel strength Y1 in equation (3) is a strength at a time when the film substrate 130 is separated from the first adhesive layer 151a bonded to the fixing substrate 140, and the peel strength Y2 in equation (4) is a strength at a time when the film substrate 130 is separated from the fixing substrate 140 together with the first adhesive layer 151a.

The second adhesive layer 152a has a higher adhesive strength (adhesion strength) than the first adhesive layer 151a. Therefore, the second adhesive layer 152a may satisfy neither equation (3) nor equation (4).

The same type of resin material can be used for the first adhesive layer 151a and second adhesive layer 152a in the case that the adhesive strength of the resin material can be changed by light irradiation or thermal treatment. For example, a resin material the adhesive strength of which can be reduced by ultraviolet light irradiation is applied to a whole area to be located between the film substrate 130 and the fixing substrate 140. At that time, the adhesive strength of the resin material to be located on the first area is reduced by irradiating the first area with ultraviolet light. The first adhesive layer 151a and the second adhesive layer 152a can be formed in this way.

Different types of resin materials may be used for the first adhesive layer 151a and second adhesive layer 152a. For example, a dispenser or the like is used to apply a resin material with a weak adhesive strength to an area be located on the first area and apply a resin material with a strong adhesive strength to an area to be located on the second area. Thus, the first adhesive layer 151a can be formed in the first area and the second adhesive layer 152a can be formed in the second area.

In the second example, the first area (area shaded with coarse dots in FIG. 8) is the non-display area of the film substrate 130 in a plan view. That is, the first area includes not only the resin circumferential area but also the non-display area in which the driver IC 120 and the like are disposed.

The non-display area is an area on which at least one of the FPC board 113 (not illustrated) and the driver IC 120 is disposed. Specifically, the non-display area is an area excluding the display area and its peripheral an area. As illustrated in FIG. 8, the non-display area (i.e. the first area) is a rectangular area on which the driver IC 120 and one side of the film substrate 130 are located.

The display area and its peripheral area form the second area (area shaded with fine dots in FIG. 8). Specifically, the second area is the whole area of the film substrate 130 excluding the first area. The display area is an area on which the display part 101 is disposed in a plan view. The peripheral area of the display area is a frame-like area around the display part 101. As illustrated in FIG. 8, the display area and its peripheral area, which constitute the second area, form a rectangular area on which the display part 101 and one side of the film substrate 130 are located.

Thus, in the second embodiment, equation (1) is satisfied in the non-display area (i.e. the first area) of the film substrate 130 in a plan view. Specifically, at least one of equation (3) and equation (4) is satisfied in the non-display area of the film substrate 130 in a plan view.

Therefore, since, in the first area, the film substrate 130 is separated from the fixing substrate 140 before the film substrate 130 undergoes a shear failure, it is possible to suppress a shear failure from occurring in the film substrate 130. On the second area, since the second adhesive layer 152a with a strong adhesive strength is provided, it is possible to suppress separation between the film substrate 130 and the fixing substrate 140.

As described above, when the display panel 10a in the second example is used, it is possible to suppress the film substrate 130 from undergoing a shear failure and thereby provide the display device 1 that achieves superior display quality and high reliability.

Figure 9B:
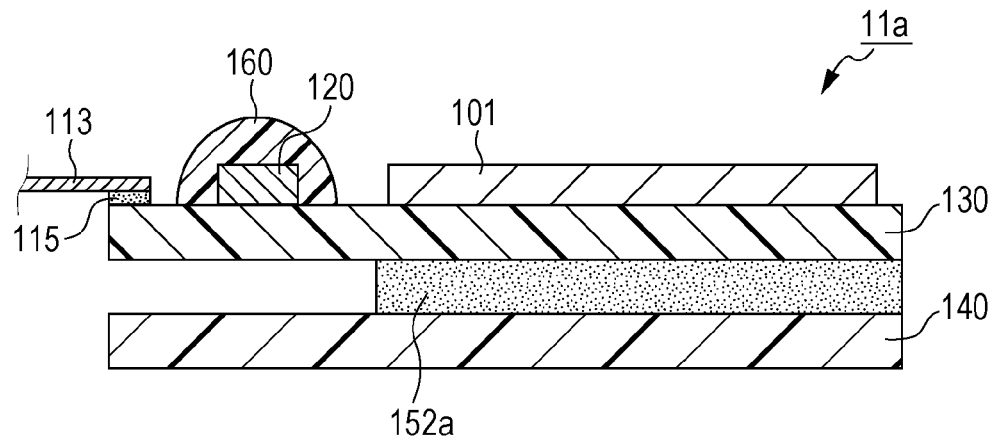
FIG. 9B is a cross-sectional view illustrating the structure of another display panel in the second example in the embodiment.

The adhesive layer may not be provided on the first area. FIG. 9B is a cross-sectional view illustrating the structure of a display panel 11a in the second example in this embodiment, as taken along a line 9A-9A in FIG. 8.

Only on the second area, the second adhesive layer 152a may be provided without the first adhesive layer 151a being provided on the first area, as illustrated in FIG. 9B. That is, in the first area, the peel strength Y1 in equation (3) and the peel strength Y2 in equation (4) are both 0. On the first area, a hollow space is formed between the film substrate 130 and the fixing substrate 140, as illustrated in FIG. 9B. That is, in the first area, the film substrate 130 is in a state in which it is floated above the fixing substrate 140. Alternatively, if the film substrate 130 is adequately flexible, in the first area, the film substrate 130 may be brought into contact with the fixing substrate 140 without being bonded to the fixing substrate 140.

The first adhesive layer 151a that satisfies at least one of equation (3) and equation (4) may be provided on the second area.

In the example illustrated in FIG. 9B, when the protective resin 160 contracts in its curing process, a force with which the film substrate 130 is pulled toward the fixing substrate 140 is not exerted on the first area, so the film substrate 130 does not undergo a shear failure. Therefore, it is possible to suppress the film substrate 130 from undergoing a shear failure and thereby provide the display device 1 that achieves superior display quality and high reliability.

4-3. Third Example

Resin Area

Figure 11A:
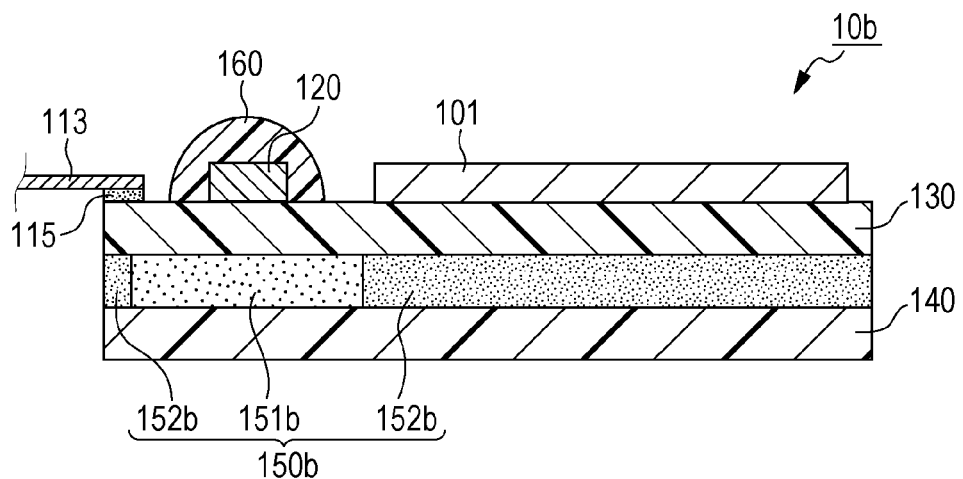
FIG. 11A is a cross-sectional view illustrating the structure of the display panel in the third example in the embodiment.

FIG. 10 is a plan view illustrating the placement of an adhesive layer 150b in a display panel 10b in a third example in this embodiment. FIG. 11A is a cross-sectional view illustrating the structure of the display panel 10b in the third example in this embodiment, as taken along a line 11A-11A in FIG. 10.

In the third example, the adhesive layer 150b includes a first adhesive layer 151b provided on the first area and a second adhesive layer 152b provided on the second area, as illustrated in FIGS. 10 and 11A. The second area is an area different from the first area in a plan view.

The first adhesive layer 151b is an adhesive layer that satisfies at least one of equation (3) and equation (4). That is, the peel strength Y1 in equation (3) is a strength at a time when the film substrate 130 is separated from the first adhesive layer 151b bonded to the fixing substrate 140, and the peel strength Y2 in equation (4) is a strength at a time when the film substrate 130 is separated from the fixing substrate 140 together with the first adhesive layer 151b.

The second adhesive layer 152b has a higher adhesive strength (or adhesion strength) than the first adhesive layer 151b. Therefore, the second adhesive layer 152b may satisfy neither equation (3) nor equation (4).

The first adhesive layer 151b and second adhesive layer 152b are formed in the same way as in the second example.

In the third example, the first area (area shaded with coarse dots in FIG. 10) includes the resin area and resin circumferential area of the film substrate 130 in a plan view.

The resin area is an area on which the protective resin 160 is disposed. Specifically, the resin area is an area enclosed by the outline of the protective resin 160 in a plan view. The resin circumferential area is an area that includes the circumferential edges of the protective resin 160. Specifically, the resin circumferential area is an area, having a certain width, that includes the outline of the protective resin 160 in a plan view. The certain width is determined according to, for example, the size of the protective resin 160.

The first area has a shape along the shape of the protective resin 160 in a plan view. For example, if the shape of the protective resin 160 is rectangular in a plan view as illustrated in FIG. 10, the first area also has a rectangular shape. Specifically, the first area has a slightly larger shape than the protective resin 160 in a plan view. The circumference of the first area is enclosed by the second area.

The second area (area shaded with fine dots in FIG. 10) is the whole area of the film substrate 130 excluding the first area. Specifically, the second area includes the display area, its peripheral area, and the non-display area excluding the resin area and resin circumferential area. However, this is not a limitation; the second area may include only the display area.

Thus, in the third example, equation (1) is satisfied in the resin area and resin circumferential area, which form the first area in the film substrate 130 in a plan view. Specifically, at least one of equation (3) and equation (4) is satisfied in the resin area and resin circumferential area in the film substrate 130 in a plan view.

Therefore, since, in the first area, the film substrate 130 is separated from the fixing substrate 140 before the film substrate 130 undergoes a shear failure, it is possible to suppress a shear failure from occurring in the film substrate 130. On the second area, since the second adhesive layer 152b having a strong adhesive strength is provided, it is possible to suppress separation between the film substrate 130 and the fixing substrate 140.

As described above, when the display panel 10b in the third example is used, it is possible to suppress the film substrate 130 from undergoing a shear failure and thereby provide the display device 1 that achieves superior display quality and high reliability.

Figure 11B:
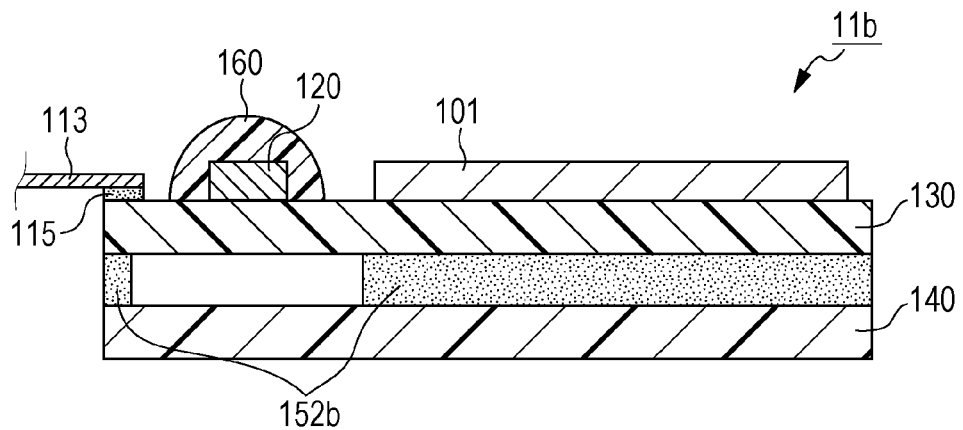
FIG. 11B is a cross-sectional view illustrating the structure of another display panel in the third example in the embodiment.

The adhesive layer may not be provided on the first area. FIG. 11B is a cross-sectional view illustrating the structure of a display panel 11b in the third example in this embodiment, as taken along a line 11A-11A in FIG. 10.

Only on the second area, the second adhesive layer 152b may be provided without the first adhesive layer 151b being provided on the first area, as illustrated in FIG. 11B. That is, in the first area, the peel strength Y1 in equation (3) and the peel strength Y2 in equation (4) are both 0. On the first area, a hollow space is formed between the film substrate 130 and the fixing substrate 140, as illustrated in FIG. 11B. That is, in the first area, the film substrate 130 is in a state in which it is floated above the fixing substrate 140.

The first adhesive layer 151b that satisfies at least one of equation (3) and equation (4) may be provided on the second area.

In the example illustrated in FIG. 11B, when the protective resin 160 contracts in its curing process, a force with which the film substrate 130 is pulled toward the fixing substrate 140 is not exerted on the first area, so the film substrate 130 does not undergo a shear failure. Therefore, it is possible to suppress the film substrate 130 from undergoing a shear failure and thereby provide the display device 1 that achieves superior display quality and high reliability.

4-4. Fourth Example

Resin Circumferential Area

Figure 12:
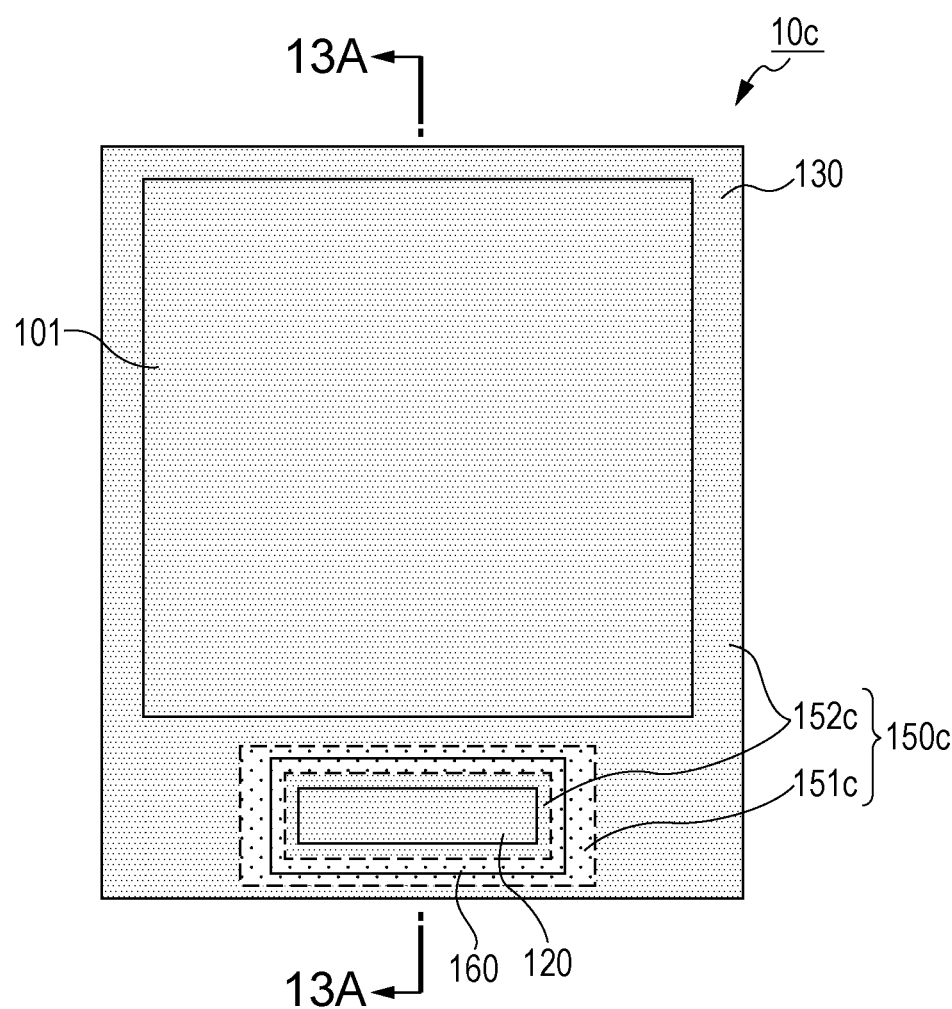
FIG. 12 is a plan view illustrating the placement of an adhesive layer in a display panel in a fourth example in the embodiment.
Figure 13A:
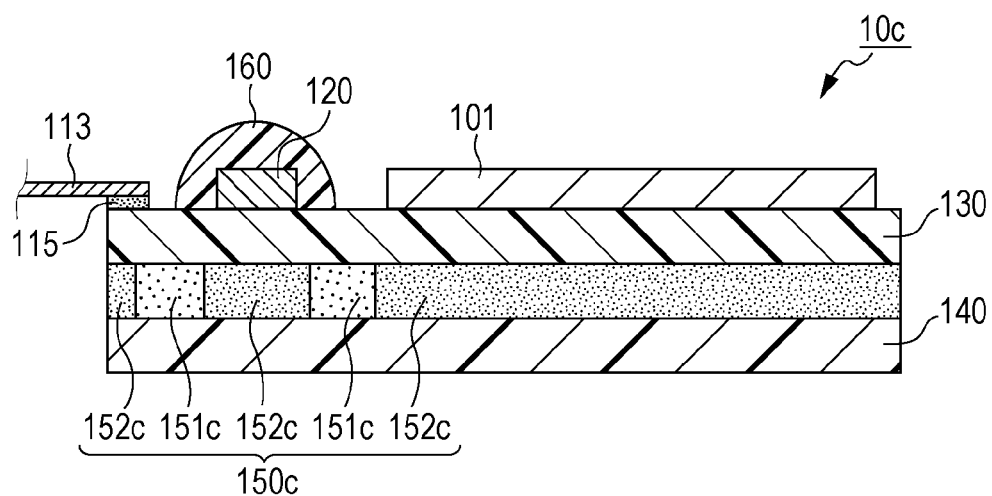
FIG. 13A is a cross-sectional view illustrating the structure of the display panel in the fourth example in the embodiment.

FIG. 12 is a plan view illustrating the placement of an adhesive layer 150c in a display panel 10c in a fourth example in the embodiment. FIG. 13A is a cross-sectional view illustrating the structure of the display panel 10c in the fourth example in this embodiment, as taken along a line 13A-13A in FIG. 12.

In the fourth example, the adhesive layer 150c includes a first adhesive layer 151c provided on the first area and a second adhesive layer 152c provided on the second area, as illustrated in FIGS. 12 and 13A. The second area is an area different from the first area in a plan view.

The first adhesive layer 151c is an adhesive layer that satisfies at least one of equation (3) and equation (4). That is, the peel strength Y1 in equation (3) is a strength at a time when the film substrate 130 is separated from the first adhesive layer 151c bonded to the fixing substrate 140, and the peel strength Y2 in equation (4) is a strength at a time when the film substrate 130 is separated from the fixing substrate 140 together with the first adhesive layer 151c.

The second adhesive layer 152c has a higher adhesive strength (or adhesion strength) than the first adhesive layer 151c. Therefore, the second adhesive layer 152c may satisfy neither equation (3) nor equation (4).

The first adhesive layer 151c and second adhesive layer 152c are formed in the same way as in the second example.

In the fourth example, the first area (area shaded with coarse dots in FIG. 12) is the resin circumferential area in the film substrate 130 in a plan view.

The resin circumferential area is an area, with a certain width, that includes the outline of the protective resin 160 in a plan view. Specifically, the resin circumferential area is a frame-like area, in a plan view, with a certain width, the resin circumferential area being located along the outline of the protective resin 160. The outline of the protective resin 160 passes through, for example, the vicinity of the center of the frame width. The certain width is determined according to, for example, the size of the protective resin 160.

The first area has a shape along the shape of the protective resin 160 in a plan view. For example, if the shape of the protective resin 160 is rectangular in a plan view as illustrated in FIG. 12, the first area also has a frame-like rectangular shape. The outer edges of the frame of the first area are enclosed by the second area. The second area is provided inside the frame as well.

The second area (area shaded with fine dots in FIG. 12) is the whole area of the film substrate 130 excluding the first area. Specifically, the second area includes the display area, its peripheral area, and the non-display area excluding the resin circumferential area. However, this is not a limitation; the second area may include only the display area.

Thus, in the fourth example, equation (1) is satisfied in the resin circumferential area (i.e. the first area) of the film substrate 130 in a plan view. Specifically, at least one of equation (3) and equation (4) is satisfied in the resin circumferential area in the film substrate 130 in a plan view.

Therefore, since, in the first area, the film substrate 130 is separated from the fixing substrate 140 before the film substrate 130 undergoes a shear failure, it is possible to suppress a shear failure from occurring in the film substrate 130. On the second area, since the second adhesive layer 152c having a strong adhesive strength is provided, it is possible to suppress separation between the film substrate 130 and the fixing substrate 140.

In the fourth example, the first adhesive layer 151c is provided only on the resin circumferential area, in which a shear force is easily generated. The first adhesive layer 151c has a weaker adhesive strength than the second adhesive layer 152c. That is, the first adhesive layer 151c is likely to cause separation. Thus, if the area on which the first adhesive layer 151c is provided is narrowed, the film substrate 130 is less likely to be separated from the fixing substrate 140. Therefore, the shape of the film substrate 130 is easily maintained, achieving superior display quality and high reliability.

As described above, when the display panel 10c in the fourth example is used, it is possible to suppress the film substrate 130 from undergoing a shear failure and thereby provide the display device 1 that achieves superior display quality and high reliability.

Figure 13B:
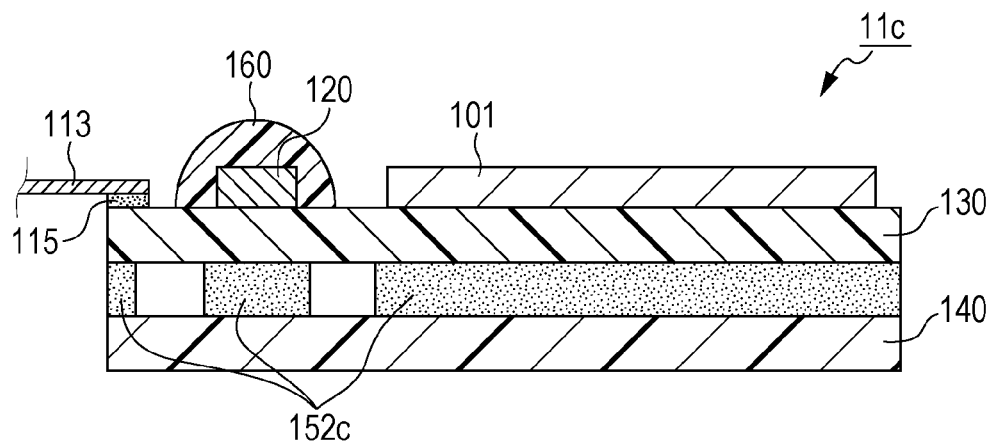
FIG. 13B is a cross-sectional view illustrating the structure of another display panel in the fourth example in the embodiment.

The adhesive layer may not be provided on the first area. FIG. 13B is a cross-sectional view illustrating the structure of a display panel 11c in the fourth example in this embodiment, as taken along a line 13A-13A in FIG. 12.

Only on the second area, the second adhesive layer 152c may be provided without the first adhesive layer 151c being provided on the first area, as illustrated in FIG. 13B. That is, in the first area, the peel strength Y1 in equation (3) and the peel strength Y2 in equation (4) are both 0. On the first area, hollow spaces are formed between the film substrate 130 and the fixing substrate 140, as illustrated in FIG. 13B. That is, in the first area, the film substrate 130 is in a state in which it is floated above the fixing substrate 140.

The first adhesive layer 151c that satisfies at least one of equation (3) and equation (4) may be provided on the second area.

In the example illustrated in FIG. 13B, when the protective resin 160 contracts in its curing process, a force with which the film substrate 130 is pulled toward the fixing substrate 140 is not exerted on the first area, so the film substrate 130 does not undergo a shear failure. Therefore, it is possible to suppress the film substrate 130 from undergoing a shear failure and thereby provide the display device 1 that achieves superior display quality and high reliability.

Modification

Although, in the above embodiment, the protective resin 160 has been disposed so as to cover the circumferential edges of the driver IC 120, this is not a limitation. In this modification, a protective resin may be disposed so as to cover part of the circumferential edges of the FPC board 113.

FIG. 14 is a plan view illustrating the structure of a display device 2 in this modification.

As illustrated in FIG. 14, the display device 2 in this modification differs from the display device 1 in FIG. 1 in that a display panel 20 is substituted for the display panel 10. The display panel 20 differs from the display panel 10 in that a protective resin 260 is substituted for the protective resin 160.

Figure 15A:
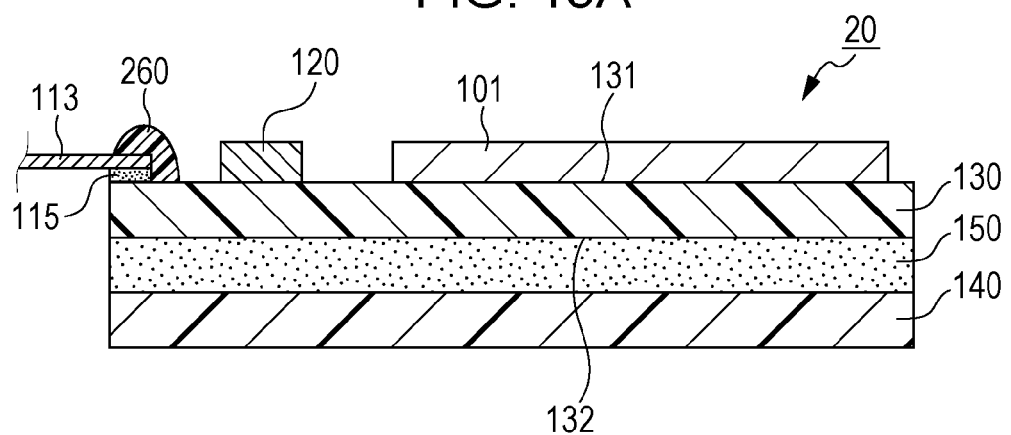
FIG. 15A is a cross-sectional view illustrating the structure of a display panel in the modification of the embodiment.

FIG. 15A is a cross-sectional view illustrating the structure of the display panel 20 in this modification, as taken along a line 15A-15A in FIG. 14.

The protective resin 260 is disposed on the first main surface 131 so as to cover part of the circumferential edges of the FPC board 113. The part of the circumferential edges of the FPC board 113 is specifically part of the outline of the FPC board 113 in a plan view. More specifically, the part of the circumferential edges of the FPC board 113 is a portion that includes part, of the outline of the FPC board 113, of the film substrate 130 in a plan view and also includes a connected portion between the FPC board 113 and the film substrate 130 (that is, the conductive adhesive 115).

The protective resin 260 brings the FPC board 113 into tight contact with the film substrate 130 so that the FPC board 113 is fixed to the film substrate 130, suppressing the FPC board 113 from being separated from the film substrate 130. When the protective resin 260 is made of a resin material that is highly resistant to moisture, the protective resin 260 suppresses the conductive adhesive 115 that interconnects the FPC board 113 and film substrate 130 from being deteriorated due to moisture in the ambience.

The protective resin 260 can be made of the same material as the protective resin 160 in the embodiment described above.

Even in a case in which the protective resin 260 covers part of the circumferential edges of the FPC board 113 rather than the driver IC 120 as described above, a shear force is generated due to contraction of the protective resin 260 in the first area including the circumferential edges of the protective resin 260, as illustrated in FIGS. 5A to 5D. If, therefore, the adhesive layer 150 is provided between the film substrate 130 and the fixing substrate 140 as illustrated in FIG. 15A, it is possible to suppress the film substrate 130 from undergoing a shear failure as in the embodiment described above.

Figure 15B:
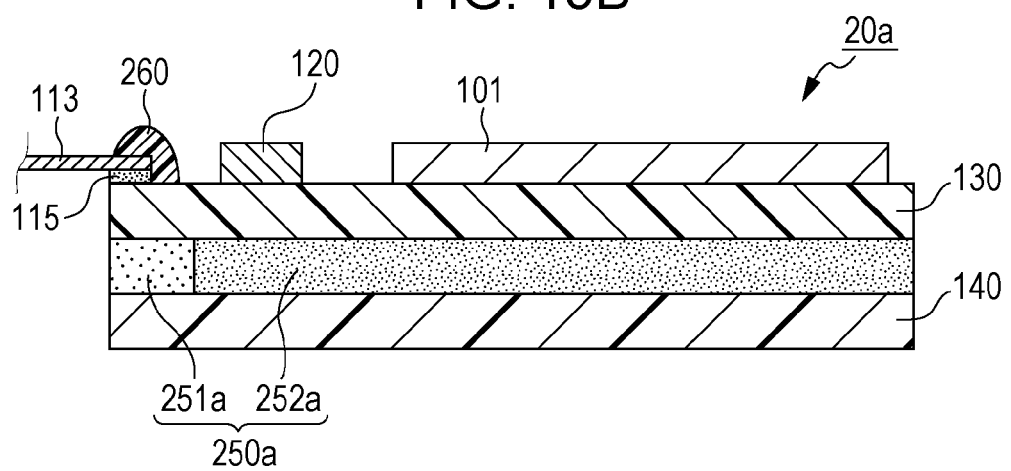
FIG. 15B is a cross-sectional view illustrating the structure of another display panel in the modification of the embodiment.

In a display panel 20a in FIG. 15B, an adhesive layer 250a, which includes a first adhesive layer 251a and a second adhesive layer 252a having different adhesive strengths, may be provided as in the second to fourth examples in the above embodiment. FIG. 15B is a cross-sectional view illustrating the structure of the display panel 20a, which is different from the structure shown in FIG. 15A, in this modification of the embodiment, as taken along a line 15A-15A in FIG. 14.

The first adhesive layer 251a is an adhesive layer that satisfies at least one of equation (3) and equation (4). The first adhesive layer 251a is provided on the first area. The second adhesive layer 252a is an adhesive layer that has a higher adhesive strength than the first adhesive layer 251a. The second adhesive layer 252a is provided on the second area. The materials of the first adhesive layer 251a and second adhesive layer 252a and the methods of forming them are respectively the same as for the first adhesive layer 151a and second adhesive layer 152a in the above embodiment.

Figure 15C:
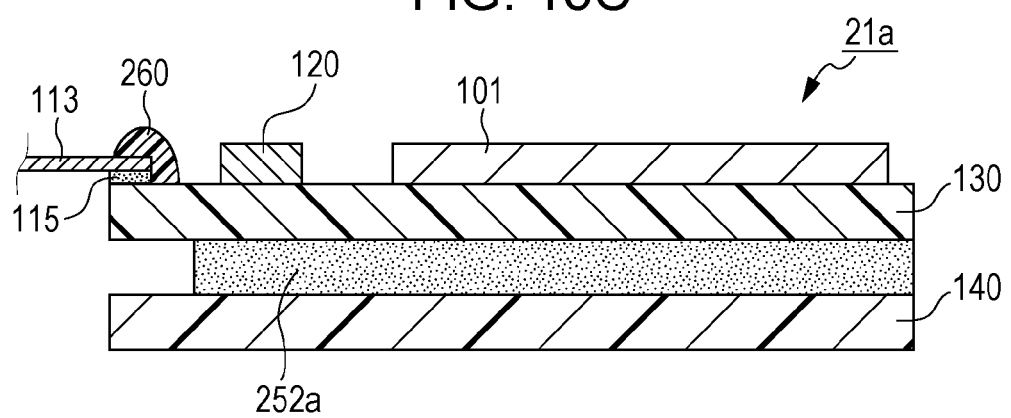
FIG. 15C is a cross-sectional view illustrating the structure of yet another display panel in the modification of the embodiment.

In a display panel 21a illustrated in FIG. 15C, the first adhesive layer 251a may not be provided on the first area. FIG. 15C is a cross-sectional view illustrating the structure of the display panel 21a, which is different from the structure shown in FIG. 15A or 15B, in this modification of the embodiment, as taken along a line 15A-15A in FIG. 14.

As described above, in the display device 2 in this modification as well, it is possible to suppress the film substrate 130 from undergoing a shear failure and thereby achieve superior display quality and high reliability, as in the embodiment.

Another Embodiment

So far, the display devices in one or a plurality of aspects have been described according to the embodiment. However, the present disclosure is not limited to the embodiment. The range of the present disclosure includes embodiments in which various modifications that a person having ordinary skill in the art thinks of are applied to the embodiment described above and also includes embodiments in which constituent elements in different embodiments are combined, without departing from the intended scope of the present disclosure.

For example, although examples in which the protective resin 160 covers the circumferential edges of the driver IC 120 and examples in which the protective resin 260 covers part of the circumferential edges of the FPC board 113 have been described in the above embodiment and modification, this is not a limitation. The protective resin only needs to be provided so as to cover at least one of part the FPC board 113 and the driver IC 120. That is, the protective resin may cover both part of the FPC board 113 and the driver IC 120.

For example, although an example in which the display panel 10 uses the COG method has been described in the above embodiment and modification, this is not a limitation. For example, the display panel may use a film-on-glass (FOG) method, in which an FPC substrate on which a driver IC is mounted is mounted on a panel substrate. That is, a driver IC may be mounted on the FPC board 113 mounted on the film substrate 130, without being mounted on the film substrate 130.

For example, although examples in which an adhesive layer includes two adhesive layers having different adhesive strengths (first adhesive layer 151a and second adhesive layer 152a, for example) have been described in the above embodiment and modification, the adhesive layer 150 may include three or more adhesive layers having different adhesive strengths. For example, a first adhesive layer having the weakest adhesive strength may be formed in the resin circumferential area, a second adhesive layer having the strongest adhesive strength may be formed in the display area, and an adhesive layer having an adhesive strength that is stronger than the adhesive strength of the first adhesive layer but weaker than the adhesive strength of the second adhesive layer may be formed in another area. Thus, it is possible to more firmly hold the shape of the display area and cause the film substrate 130 to be easily separated in the resin circumferential area, in which a shear force is likely to be generated.

Examples in which an adhesive layer is not formed on the first area have been described in the above embodiment and modification, in which case, for example, a member (e.g. a spacer) that has no bonding force may be formed instead of an adhesive layer. Alternatively, the member may be bonded only to one of the film substrate 130 and fixing substrate 140. Therefore, since a hollow space is not formed between the film substrate 130 and the fixing substrate 140, it is possible to easily hold the shape of the film substrate 130.

In the above embodiments, various changes, replacements, additions, omissions, and the like can be made within the range of claims or the range of their equivalents.

What is claimed is:
1. A display device comprising:
a film substrate having a first main surface and a second main surface that is opposite to the first main surface;
display pixels located on the film substrate;
at least one selected from the group consisting of a flexible printed circuit board located on the first main surface and a driver integrated circuit that is located on the first main surface and drives the display pixels;
a protective resin that covers, in a plan view of the film substrate, at least an outer edge of at least one selected from the group consisting of the driver integrated circuit and part of the flexible printed circuit board;

a fixing substrate facing the second main surface; and an adhesive layer that is located between the second main surface and the fixing substrate, and bonds the film substrate to the fixing substrate; wherein the film substrate has a first area including at least an outer edge of the protective resin in a plan view of the film substrate, and in the first area, a product of a thickness t [m] of the film substrate by a shear strength X [N/m$^2$] of the film substrate is greater than a peel strength Y [N/m] with which the film substrate is separated from the fixing substrate.

2. The display device according to claim 1, wherein the first area further includes an area covered with the protective resin in a plan view of the film substrate.

3. The display device according to claim 2, wherein the film substrate has a display area on which the display pixels are located and a non-display area on which the display pixels are not located but the at least one selected from the group consisting of the flexible printed circuit board and the driver integrated circuit is located, the first area includes the non-display area.

4. The display device according to claim 3, wherein the first area further includes the display area.

5. The display device according to claim 1, wherein:

the adhesive layer includes a first adhesive layer located between the second main surface in the first area and the fixing substrate; and the peel strength Y is a strength with which the film substrate is separated from the first adhesive layer.

6. The display device according to claim 1, wherein:

the adhesive layer includes a first adhesive layer located between the second main surface in the first area and the fixing substrate; and the peel strength Y is a strength with which the film substrate is separated from the fixing substrate together with the first adhesive layer.

7. The display device according to claim 5, wherein the film substrate has a second area different from the first area, and the adhesive layer further includes a second adhesive layer between the second main surface in the second area and the fixing substrate, the second adhesive layer having a stronger adhesive strength than the first adhesive layer.

8. The display device according to claim 1, wherein the adhesive layer is not located in the first area.

\* \* \* \* \*